United States Patent [19]

Johnston

[11] Patent Number: 5,754,879
[45] Date of Patent: May 19, 1998

[54] INTEGRATED CIRCUIT FOR EXTERNAL BUS INTERFACE HAVING PROGRAMMABLE MODE SELECT BY SELECTIVELY BONDING ONE OF THE BOND PADS TO A RESET TERMINAL VIA A CONDUCTIVE WIRE

[75] Inventor: Thomas Kevin Johnston, Austin, Tex.

[73] Assignee: Motorola, Inc., Schaumburg, Ill.

[21] Appl. No.: 717,516

[22] Filed: Sep. 23, 1996

[51] Int. Cl.⁶ .................................................. G06F 13/00
[52] U.S. Cl. ...................... 395/800.39; 395/800.43; 395/834; 365/189.03
[58] Field of Search .................. 395/800.32, 800.36, 395/37, 38, 39, 4, 42, 43, 834, 800.38, 800.39, 800.43; 365/222, 189.03

[56] References Cited

U.S. PATENT DOCUMENTS

| | | | |
|---|---|---|---|
| 4,432,049 | 2/1984 | Shaw et al. | 395/834 |
| 4,825,415 | 4/1989 | Nakaizumi | 365/189.05 |
| 5,036,272 | 7/1991 | Cho et al. | 371/22.1 |
| 5,103,167 | 4/1992 | Okano et al. | 371/22.1 |
| 5,161,124 | 11/1992 | Love | 365/222 |
| 5,291,123 | 3/1994 | Brown | 323/369 |
| 5,303,180 | 4/1994 | McAdams | 365/63 |
| 5,353,250 | 10/1994 | McAdams | 365/189.03 |
| 5,508,650 | 4/1996 | Grimm et al. | 327/365 |
| 5,557,573 | 9/1996 | McClure | 365/201 |
| 5,623,687 | 4/1997 | Yishay et al. | 395/800.43 |
| 5,649,219 | 7/1997 | Matsushima | 395/800.38 |

*Primary Examiner*—Meng-Ai T. An
*Attorney, Agent, or Firm*—Keith E. Witek; Kent J. Cooper

[57] ABSTRACT

A method and apparatus for allowing an integrated circuit to be hard-wired into one of a plurality of modes of operation by providing a plurality of mode bonding pads (104–108). Based upon customer demand, a reset post (102) or like external terminal of the integrated circuit is wire bonded or conductively coupled to only one of the plurality of mode pads (104–108). By bonding only one of the mode pads (104–108) to the reset pin, one of the plurality of distinct modes of operation is enabled upon reset.

21 Claims, 5 Drawing Sheets

INTEGRATED CIRCUIT FOR EXTERNAL BUS INTERFACE HAVING PROGRAMMABLE MODE SELECT BY SELECTIVELY BONDING ONE OF THE BOND PADS TO A RESET TERMINAL VIA A CONDUCTIVE WIRE

FIELD OF THE INVENTION

The present invention relates generally to data processing systems, and more particularly, to selectively electrically connecting bond pads to external pins to allow for mode selection of an integrated circuit.

BACKGROUND OF THE INVENTION

It is undesirable to design and build multiple single-function integrated circuits if there is a high degree of similarity between them. It is preferable instead to design a single integrated circuit which can operate in one of several modes by incorporating mode control circuitry. This has been accomplished in the prior art in various ways.

Shown in FIG. 1 is a prior art device 10 having a multi-bonded power post 32 (VDD) or a multi-bonded ground post 34 (VSS). VDD post 32 and VSS post 34 are adjacent package pins, and a configuration bond pad 38 (mode bond pad) is placed between VDD bond pad 36 and VSS bond pad 40. The Mode bond pad 38 is bonded to either VDD post 32 or the VSS post 34 to select one of two possible modes. It is important to note that prior art device 10 is limited to one of two possible modes. In a first mode, VSS post 34 is electrically connected to both mode bond pad 38 and VSS bond pad 40, while VDD post 32 is only electrically connected to VDD bond pad 36. In a second mode, VDD post 32 is electrically connected to both mode bond pad 38 and VDD bond pad 36, while VSS post 34 is only electrically connected to VSS bond pad 40. However, with this prior art device it is impossible to determine if mode bond pad 38 is actually connected to either VDD post 32 or VSS post 34 because VDD post 32 and VSS post 34 are always electrically coupled to VDD bond pad 36 and VSS bond pad 40, respectively. Therefore, an open circuit cannot be detected to the mode bond pad 38. In addition, this prior art device requires that VDD post 32 be adjacent to VSS post 36, which violates design rules for small lead-pitch packages and makes electrical testing of the device hazardous because VDD and VSS are very near each other and during testing they may be shorted to one another. Furthermore, there is a limit to the number of bonding pads which may be electrically coupled to the same package post. Currently that limit is two. Therefore, if VDD post 32 is electrically coupled to both VDD bond pad 36 and mode bond pad 38 then VDD post 32 cannot be electrically coupled to a second VDD bond pad in order to improve power distribution to the device and/or reduce wire bond inductance. Similarly, VSS post 34 has the same limitation.

Shown in FIG. 2 is another prior art device 12 having a power post 32 (VDD). Mode bond pad 38 is either electrically coupled to VDD post 32 or is not electrically coupled to any package post at all. It is important to note that prior art device 12 is also limited to one of two possible modes. In a first mode, VDD post 32 is electrically connected to both mode bond pad 38 and VDD bond pad 36. In a second mode, VDD post 32 is electrically connected to only VDD bond pad 36. With this prior art device it is difficult to determine if mode bond pad 38 is actually connected to VDD post 32. Due to this VDD connection scheme an open circuit cannot be detected. In addition, if prior art device 12 is operating in the first mode, then VDD post 32 cannot be electrically coupled to a second VDD bond pad in order to improve power distribution and induction to the device. Furthermore, if prior art device 12 is operating in the first mode, then power is consumed or wasted because VDD post 32 is also electrically coupled to ground through resistor 39. Low power devices are preferred for many applications. It should also be appreciated that, in some prior art devices a VSS post is used instead of a VDD post, in which case resistor 39 is electrically connected to VDD instead of ground.

Shown in FIG. 3 is a prior art device 14 having a power post 32 (VDD) and a signal post 42 (SIG). Mode bond pad 38 is either electrically coupled to VDD post 32 or is not electrically coupled any package post at all, and SIG post 42 is electrically coupled to signal bond pad 44. Prior art device 14 is also limited to one of two possible modes. In a first mode, VDD post 32 is electrically connected to both mode bond pad 38 and VDD bond pad 36. In a second mode, VDD post 32 is only electrically connected to VDD bond pad 36. However, with this prior art device it is difficult to determine if mode bond pad 38 is actually connected to VDD post 32. Therefore, an open circuit cannot be detected. In addition, if prior art device 14 is operating in the first mode, then VDD post 32 cannot be electrically coupled to a second VDD bond pad in order to improve power distribution to the device. It should be noted that the additional circuitry in this device helps to reduce power consumption but this circuitry also introduces other problems. More specifically, if the device is operating in the second mode and the SIG signal is in a state which turns off gated resistor 41, then the input from mode bond pad 38 to flip-flop 43 is floating and floating nodes are subject to noise variations. It should also be appreciated that in some prior art devices a VSS post is used instead of a VDD post, in which case gated resistor 41 is electrically connected to VDD instead of ground.

Shown in FIG. 4 is a prior art device 16 having a power post 32 (VDD) and a signal post 42 (SIG). Mode bond pad 38 is either electrically coupled to VDD post 32 or is not electrically coupled any package post at all, and SIG post 42 is electrically coupled to signal bond pad 44. Prior art device 16 is also limited to one of two possible modes. In a first mode, VDD post 32 is electrically connected to both mode bond pad 38 and VDD bond pad 36. In a second mode, VDD post 32 is only electrically connected to VDD bond pad 36. However, with this prior art device it is difficult to determine if mode bond pad 38 is actually connected to VDD post 32. Therefore, an open circuit cannot be detected. In addition, if prior art device 14 is operating in the first mode, then VDD post 32 cannot be electrically coupled to a second VDD bond pad in order to improve power distribution to the device. It should be noted that the circuitry in this device does not allow the input to flip-flop 43 to float. However, it does not fully eliminate the power dissipation problem discussed herein above. It should also be appreciated that in some prior art devices a VSS post is used instead of a VDD post, in which case gated resistor 41 is electrically connected to VDD instead of ground.

Shown in FIG. 5 is another prior art device 18 having a mode post 46, which is always electrically coupled to mode bond pad 38. It is important to note that prior art device 18 is also limited to one of two possible modes. In a first mode, mode post 46 is driven to a high logic level. In a second mode, mode post 46 is electrically driven to a low logic level. With this prior art device it is possible to determine whether mode bond pad 38 is electrically connected properly. However, this device requires one of the package posts be dedicated to a mode selection function. Therefore, fewer package posts are available for other functional interconnections. Moreover, sometimes it is desirable to add a mode to an existing device, but there may not be a package post available to dedicated to this new mode selection function. If the package is changed to add a mode post, then the device is no longer compatible with existing systems.

Shown in FIG. 6 is another prior art device 20 having a mode post 46, which is always electrically coupled to mode bond pad 38. It is important to note that prior art device 20 is also limited to one of two possible modes. In a first mode, mode post 46 is driven to a high logic level. In a second mode, mode post 46 is electrically driven to a low logic level or it is not driven at all. With this prior art device it is possible to determine whether mode bond pad 38 is electrically connected properly. This device solves the backward compatibility problem of device 18 if there was an unused package post which could be dedicated to the new mode selection function. However, if prior art device 20 is operated in the first mode, it consumes power through resistor 39, which is electrically connected to ground. In addition, fewer package posts are still available for other functional interconnections.

Shown in FIG. 7 is a prior art device 22 having a mode post 46, which is always electrically coupled to mode bond pad 38 and a signal post 42 (SIG), which is always electrically coupled to signal bond pad 44. It is important to note that prior art device 22 is also limited to one of two possible modes. In a first mode, mode post 46 is driven to a high logic level. In a second mode, mode post 46 is electrically driven to a low logic level or not driven at all. With this prior art device it is possible to determine whether mode bond pad 38 is electrically connected properly. However, this device requires one of the package posts to be dedicated to a mode selection function. Therefore, fewer package posts are available for other functional interconnections. It should be noted that the additional circuitry in this device helps to reduce power consumption, but if the mode post is not driven (second mode) and the SIG signal is in a state which turns off gated resistor 41, then the mode bond pad 38 input to flip-flop 43 is floating.

Shown in FIG. 8 is a prior art device 24 having a mode post 46, which is always electrically coupled to mode bond pad 38 and a signal post 42 (SIG), which is always electrically coupled to signal bond pad 44. It is important to note that prior art device 24 is also limited to one of two possible modes. In a first mode, mode post 46 is driven to a high logic level. In a second mode, mode post 46 is electrically driven to a low logic level or not driven at all. With this prior art device it is possible to determine whether mode bond pad 38 is electrically connected properly. However, this device requires one of the package posts to be dedicated to a mode selection function. Therefore, fewer package posts are available for other functional interconnections. It should be noted that the circuitry in this device does not allow the input to flip-flop 43 to float. However, it does not fully eliminate the power dissipation problem discussed herein above.

Shown in FIG. 9 is another prior art device 26 having a redefined mode post 45, which is always electrically coupled to mode bond pad 38. It is important to note that prior art device 26 is also limited to one of two possible modes. In a first mode, redefined mode post 45 is driven to a high logic level. In a second mode, redefined mode post 45 is electrically driven to a low logic level. With this prior art device it is possible to determine whether mode bond pad 38 is electrically connected properly. However, this device requires one of the existing package posts originally slated to be used for a different electrical function to be redefined and dedicated to a mode selection function instead. Therefore, fewer package posts are available for other functional interconnections. Also the old electrical function is lost and the device is no longer compatible with existing systems.

Shown in FIG. 10 is a prior art device 28 having a first signal post 50 (SIG1/MODE), which is always electrically coupled to a first signal bond pad 52 and a second signal post 54 (SIG2), which is always electrically coupled to second signal bond pad 56. It is important to note that prior art device 28 is also limited to one of two possible modes. In a first mode, first signal post 50 is driven to a high logic level, which is interpreted as a first mode selection, while second signal post 54 is in a first logic state. In a second mode, first signal post 50 is electrically driven to a low logic level, which is interpreted as a second mode selection, while second signal post 54 is still in the first logic state. With this prior art device it is possible to determine whether first signal bond pad 52 and second signal bond pad 56 are electrically connected properly. In addition, this device does not require one of the package posts to be dedicated to a mode selection function because when second signal post 54 is driven to a second logic state first signal post 50 serves another electrical function. However, this device requires an external system to drive first signal post 50 to either its mode selection function or its other electrical function depending on the logic state of second signal post 54 which is not compatible with existing systems.

FIGS. 1–10 show prior art devices where the mode of the device is determined by an external input signal, in contrast FIG. 11 shows prior art devices 30 and 31, wherein the device itself is somehow internally modified to determine it's mode of operation. For example, device 30 may internally be modified to incorporate fuses which can be blown after fabrication to determine the operating mode of the device. Alternatively, device 30 may incorporate non-volatile memory cells which are programmed after fabrication to determine the device's mode of operation. As another alternative, a special masking layer can also be used during fabrication to determine the operating mode of device 31, while all other masking layers are identical up to this special masking layer. However, the creation of fuses or non-volatile memory elements requires special processing techniques, and the use of special masking layers commits the operating mode of the device prior to packaging.

Accordingly, a need exists for a method and data processing systems wherein the mode of the device can be configured without using power or ground posts, without requiring dedicated mode pins, without consuming power, without requiring special processing or special mask layers, which is compatible with existing systems, which does not commit the operating mode of the device until it is packaged, and which is fully testable both before and after packaging in order to avoid the disadvantages discussed herein.

Figure 1:
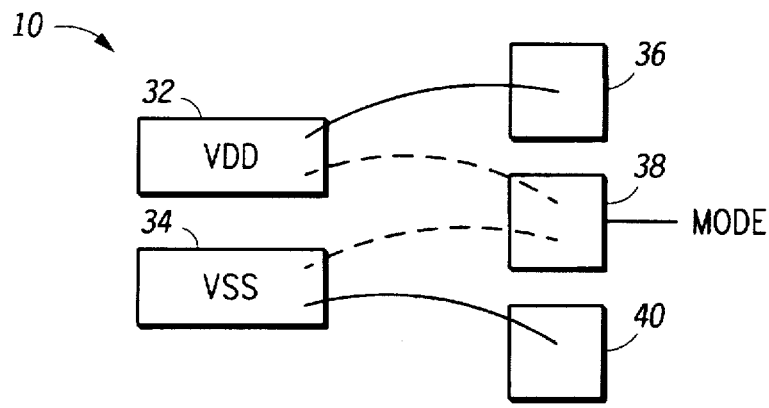
FIG. 1 illustrates, in a block diagram, a prior art method for bonding integrated circuit pads of an integrated circuit in order to enable a specific mode of operation.
Figure 2:
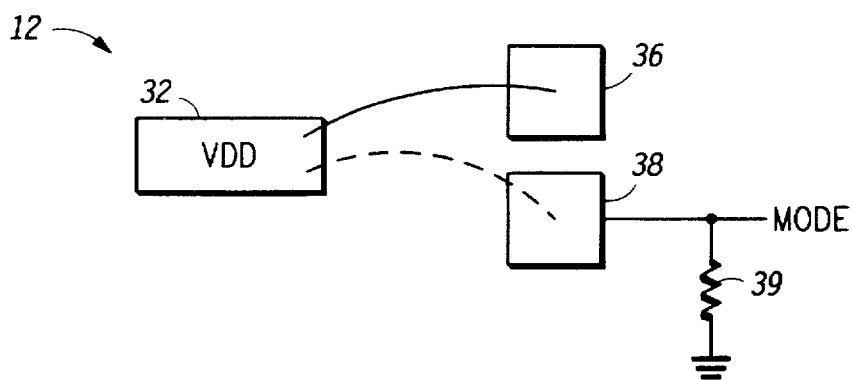
FIG. 2 illustrates, in a block diagram, another prior art method for bonding integrated circuit paths to enable a mode of operation in the integrated circuit.
Figure 3:
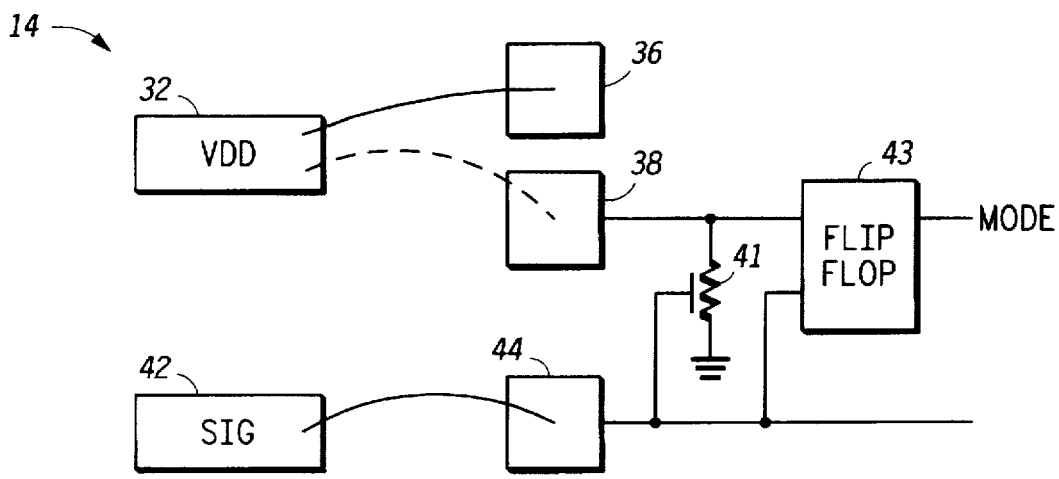
FIG. 3 illustrates, a block diagram, yet another prior art method which is used to enable a mode of operation of an integrated circuit.
Figure 4:
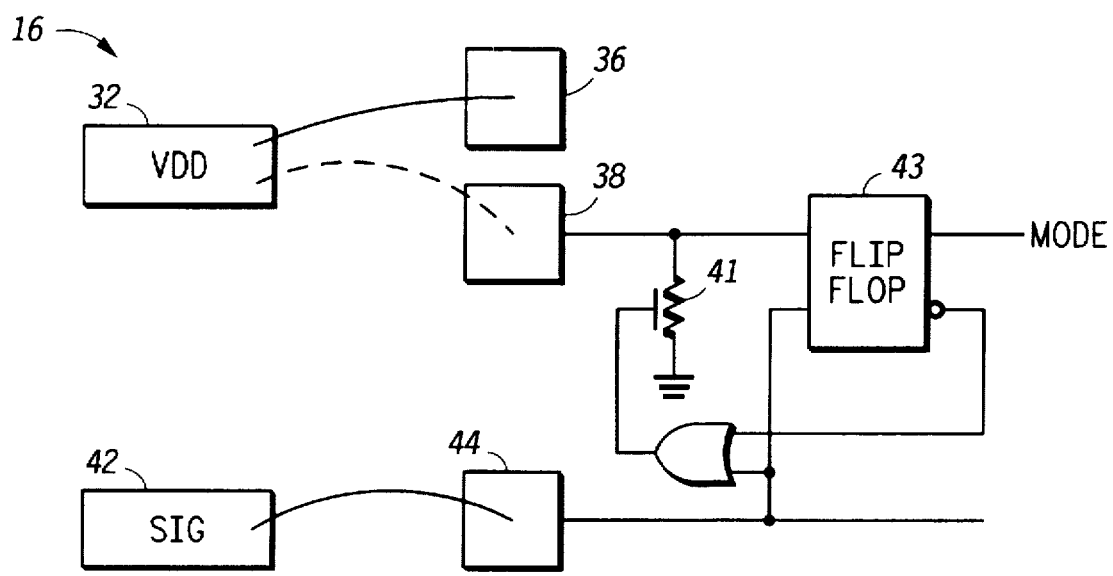
FIGS. 4, 5, 6, 7, 8, 9, and 10 illustrate alternative embodiments used in the prior art to enable various modes of operation in an integrated circuit.
Figure 5:
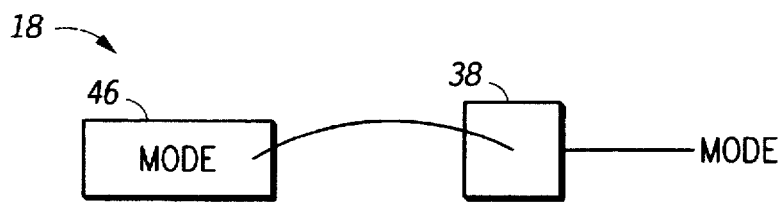
Figure 6:
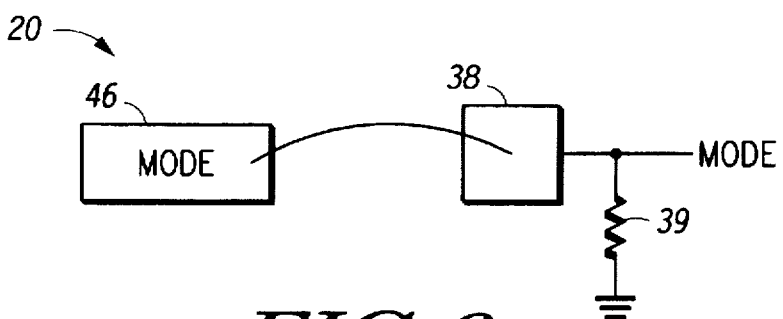
Figure 7:
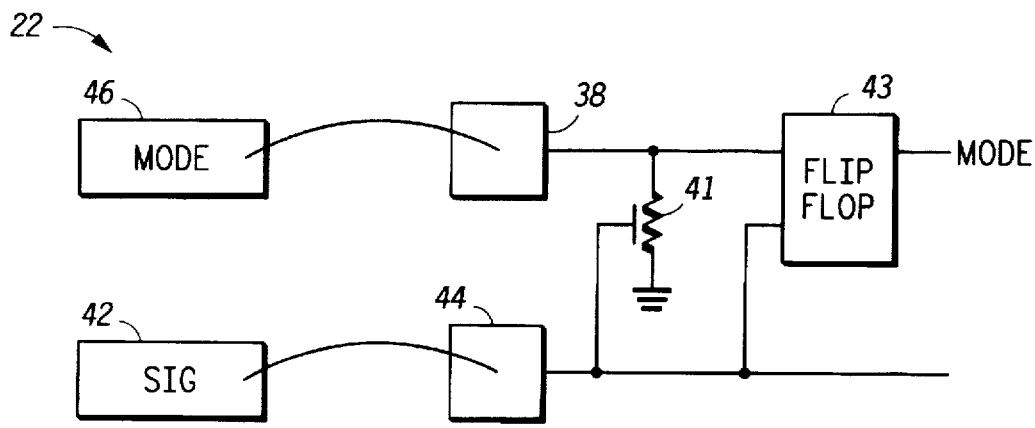
Figure 8:
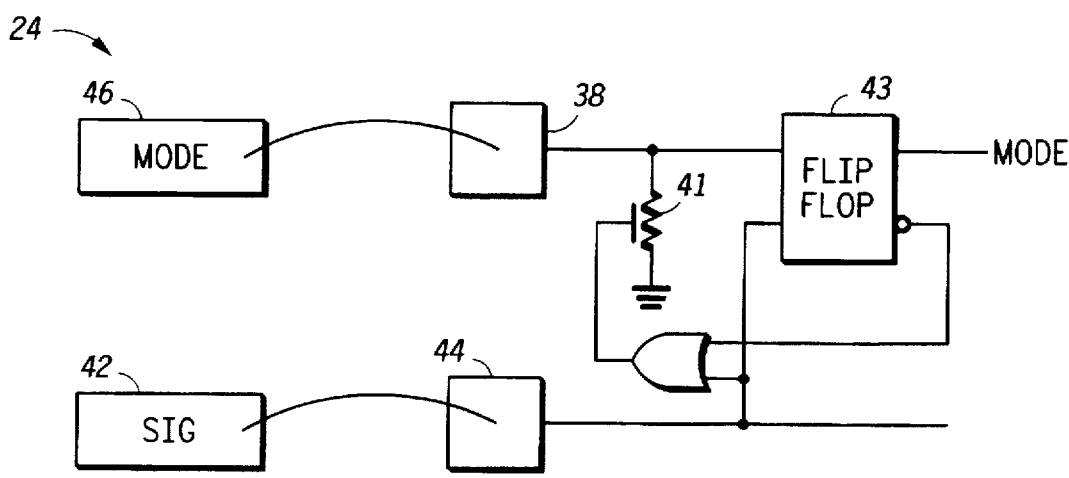
Figure 9:
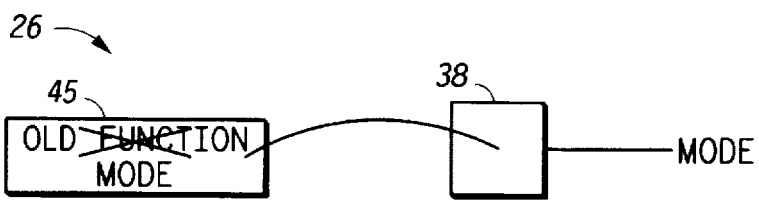
Figure 10:
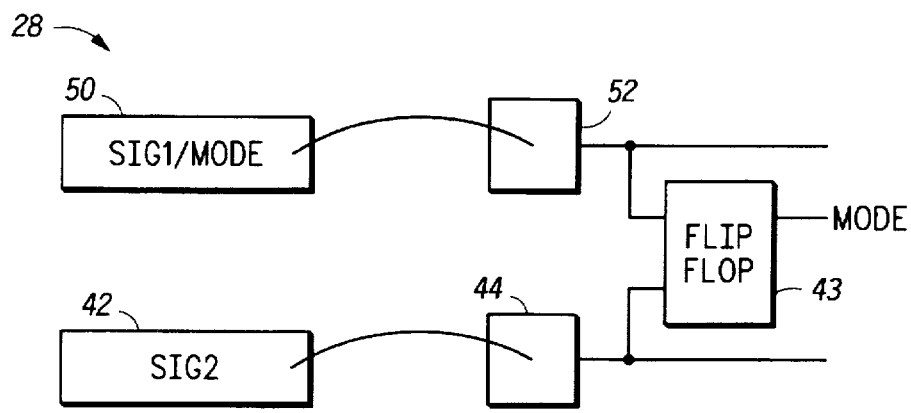
Figure 11:
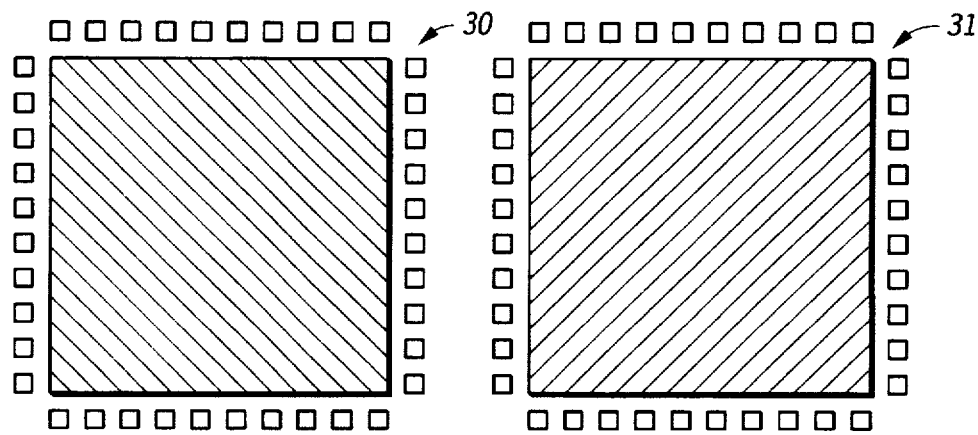
FIG. 11 illustrates a prior art technique of physically or electrically modifying an integrated circuit to enable various modes of operation.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention is a solution to all of the disadvantages discussed for the prior art. A circuit is taught herein which allows a peripheral to be configured to operate in one of many modes of operation by using the normal reset pin of the circuit while not interfering with the reset functionality of the reset pin. The circuit herein allows the mode of the device to be determined without using power (VDD) or ground (VSS) posts, without requiring dedicated mode pins, without consuming excessive power, without requiring special processing or special mask layers on an integrated circuit (IC), which allows new modes to be added to existing devices without affecting compatibility, which does not commit the operating mode of the device until it is packaged, and which is fully testable both before and after packaging.

Figure 12:
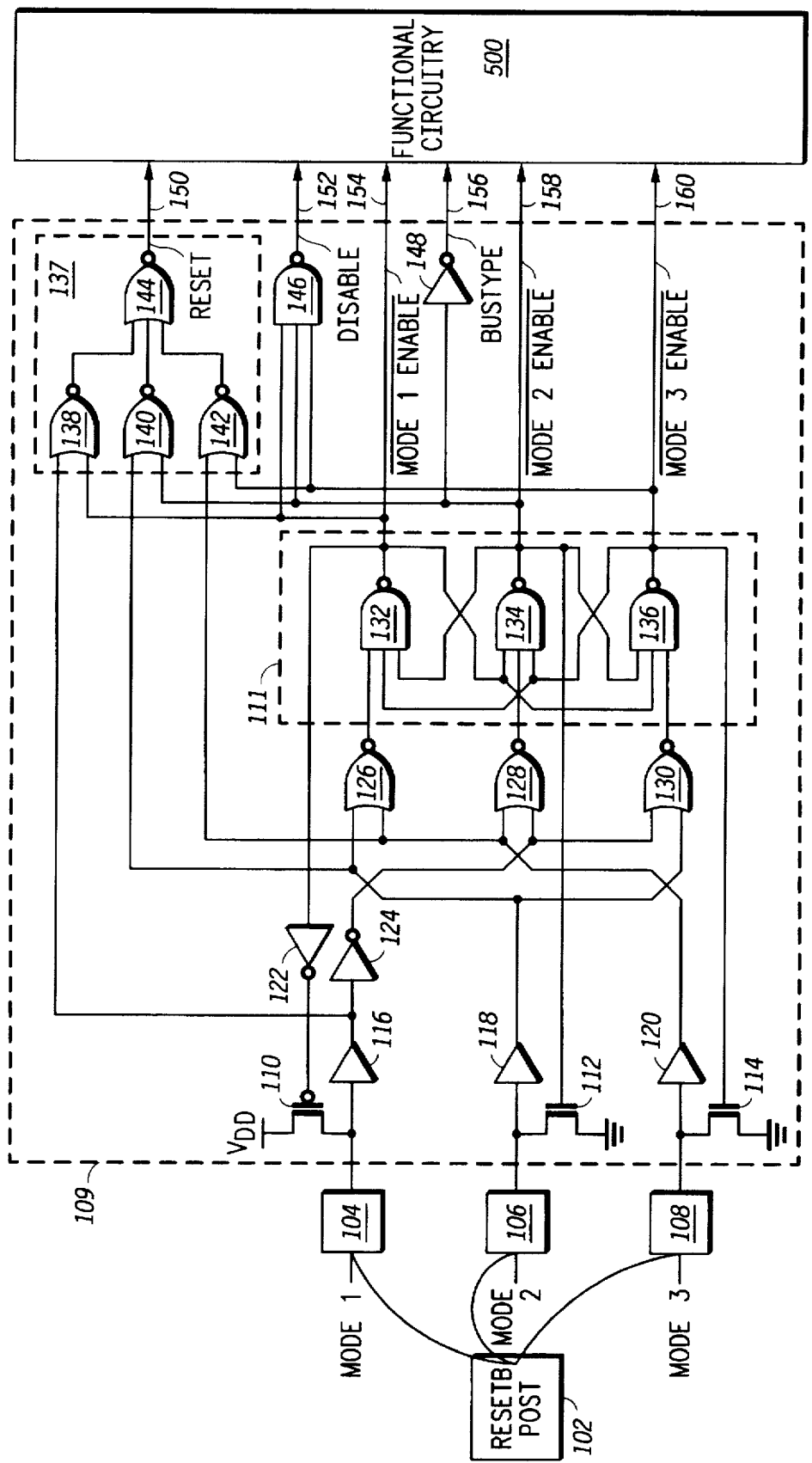
FIG. 12 illustrates, in a circuit schematic, a circuit for enabling a mode of operation of an integrated in accordance with the present invention.

Shown in FIG. 12 is a circuit diagram of a portion of an integrated circuit 100 in accordance with one embodiment of the present invention. Integrated circuit 100 comprises mode circuitry 109 and functional circuitry, wherein mode circuitry 109 is electrically coupled to the functional circuitry. In addition, integrated circuit 100 comprises a input or bidirectional package post 102 which is driven to a known logic level when integrated circuit 100 is powered up. In one preferred embodiment, package post 102 is a RESET post or external RESET terminal which performs a reset operation on integrated circuit 100. Alternatively, package post 102 may be a power (VDD) post, ground (VSS) post or a chip select post. It is important to note that the known logic level does not have to be the same for all configurations. Integrated circuit 100 also comprises a plurality of mode bond pads having mode circuitry 109 electrically connected thereto. In one embodiment, the plurality of mode bond pads comprises mode bond pad 104, mode bond pad 106, and mode bond pad 108, wherein mode bond pad 104 is used to select a first operating mode (mode 1) for integrated circuit 100, mode bond pad 106 is used to select a second operating mode (mode 2) for integrated circuit 100, and mode bond pad 108 is used to select a third operating mode(mode 3) for integrated circuit 100. In one embodiment, mode bond pad 104, mode bond pad 106, and mode bond pad 108 are located laterally adjacent to each other on the periphery of integrated circuit 100. To select a specific operating mode for integrated circuit 100 package post 102 is electrically connected to only one of the mode bond pads in the plurality of mode bond pads. For example, if it is desired for integrated circuit 100 to have the first operating mode, then package post 102 will be electrically connected to only mode bond pad 104 and unselected mode bond pads 106 and 108 will not be electrically coupled to any of the package posts or leads. Then when an electrical signal is subsequently present on package post 102, mode circuitry 109 generates a control signal which configures integrated circuit 100 to operate in the first operating mode. In one embodiment, package post 102 is electrically connected to a selected mode bond pad using conventional wire bonding techniques.

Alternatively, a selected mode bond pad may be electrically connected to an external conductive package connection or external package lead using tape automated bonding (TAB) techniques. Moreover, it should also be appreciated that the present invention may also be used with conductive bump/ball bonding techniques, in which case package post 102 would be a conductive circuit trace on a circuit board instead of a package lead or conductive package connection.

One mode of operation of integrated circuit 100 will now be discussed in detail. Package post 102 is electrically connected to mode bond pad 104. This selects a first bus interface operating mode. In the first bus interface operating mode, package post 102 is active-low. When package post 102 goes low, the output of input buffer 116 goes low, the output of inverter 124 goes high, the outputs of NOR gates 128 and 130 go low, and the outputs of NAND gates 134 and 136 go high. The outputs of 134 and 136 turn on the internal pull-down resistors 112 and 114 (transistors with a high impedance channel) respectively, which charge mode bond pad 106 and mode bond pad 108 low. When both mode bond pad 106 and mode bond pad 108 are low, the output of NOR gate 126 goes high, and the output of NAND gate 132 goes low. Finally, when the output of 132 is low, the output of inverter 122 is high, which turns off the pull-up resistor 110 (a transistor with a high impedance channel), so there is no DC current path regardless of the value of package post 102.

The NAND gates 132, 134, and 136 form a cross-coupled latch 111, and when the output of 132 goes low, cross-coupled latch 111 is in a stable state: The output of 132 (low) keeps the outputs of gates 134 and 136 high, independent of the outputs of 128 and 130. Package post 102 must be maintained at a low logic level until the latch is stable, then, once the latch is stable, the value of package post 102 applied at mode bond pad 104 is a "don't care". Until the latch is stable, the output of 132 is unknown, and the pull-up resistor 110 may be turned on, loading the package post 102 source. But the load is only temporary.

The longest segment of the path delay is the charging time of unbonded mode bond pads (two of pads 104-108). This is determined by the RC time constant of the pull-down/pull-up resistors (transistors 110-114) and the pad capacitance for pads 104-108. The capacitance is essentially a fixed quantity for a given process and geometry, but the capacitance of the unbonded pads is minimal, because there is no added capacitance from the bond wire or lead frame. The resistance of transistors 110-114 may be controllable, but the actual value of the resistance is not critical. A smaller resistance results in a shorter time constant while being a higher temporary load on the package post 102. For example, with a 200 KOhm resistor, the initial load on package post 102 is less than 50 µA, and the time constant is only about 2 µs. Since both unbonded pads are charging at the same time, the RC delays are not cumulative. Therefore, it is likely that the cross-coupled latch 111 is stable and the load on package post 102 turned off before the power supply (VDD) even reaches its operating range. However, this is not a requirement for correct operation. The proper operating mode will be latched by latch 111 whenever the configuration signal finally reaches the expected level.

A similar analysis can be performed for the configuration when package post 102 is electrically connected to the mode bond pad 106. In mode 2, when package post 102 goes high (package post 102 is active-high in bus mode 2), the outputs of gates 132, 134, and 136 settle high, low, and high respectively, and the latch 111 is in a second stable state. Resistors 110 and 114 are turned on, and resistor 112 is turned off. To select bus mode 3, package post 102 is bonded to mode bond pad 108. With package post 102 high, gates 132, 134 and 136 settle high, high, and low, respectively. Resistors 110 and 112 are turned on, and resistor 114 is turned off.

The mode control signals mode 1 enable 154, mode 2 enable 158, and mode 3 enable 160 form a 1-of-3-low code which can be used throughout the remainder of the chip for operational mode control. Mode 1 enable 154 and bus type 156 form a 2-bit code which conveys the same information in another encoded form (a 2-bit binary code instead of a 3-bit one-hot code). In the alternative, other encodings of the mode control signals of FIG. 12 are possible. In another alternative, only one encoding is needed and a dual 2-bit and 3-bit encoding is not necessary.

Mode enables 154, 158, and 160 also select the package post 102 signal from whichever pad it is bonded to, through the multiplexer 137 formed by gates 142, 140, 138, and 144, to the signal 150. Thus, the mode configuration logic is completely transparent to the normal operating function of the configuration pin(s) (in this embodiment, the normal operating function of post 102 is reset). The multiplexer 137 could easily be modified so that the signal 150 is always active-low, or always active-high, regardless of mode, but this is not shown in FIG. 12. Also, there are other ways of implementing a multiplexer to take the place of multiplexer 137.

The signals 150–160 couple to functional circuitry within the integrated circuit 100. This functional circuitry 500 can be a peripheral device adapted to be coupled to a CPU, a CPU, a memory device, or a like IC circuit.

The guaranteed level of the post 102 does not have to be the active state of the normal function of the post 102 (reset, in this case). For example, if the device has a Chip Select pin which is guaranteed to be inactive at power-up, this Chip Select can be used as a configuration pin instead of reset. In other words, an inactive level can be used to configure the modes taught herein, instead of using an active level as taught in FIG. 12.

The circuit of FIG. 12 is easily extended to allow more than three mode configurations from a single pin. In another embodiment, a pad is provided for each configuration, with a pull-up or pull-down depending on the guaranteed level of the configuration pin/post in that configuration. In other words, more than three modes or less than three modes can be implemented by adding or subtracting bond pads and adding or subtracting to circuitry 109. One NOR gate is also associated with each configuration bond pad, and the width of each NOR gate is (n−1) if n modes are desired. Each configuration pad is connected to all but one NOR gate. Similarly, the cross-coupled NAND latch is widened to n n-input gates, each one connected to all the others and one of the NOR gates.

If the package post 102 were active-high in all configurations, the inverters 124 and 122 would not be needed, and the pull-up 110 would be replaced by a pull-down instead. The multiplexer 137 could also be reduced to a single n-input OR gate. If package post 102 were active-low in all configurations, every pad would have a pull-up resistor instead of a pull-down. Instead of putting inverters (124 and 122) on each pad and each pull-up resistor, the NOR gates could all be changed to NAND gates and the cross-coupled NAND latch could be replaced by a cross-coupled NOR latch. Then the output of the NOR latch is a 1-of-n-high code instead of a 1-of-n-low code, and the multiplexer 137 can be reduced to a single n-input AND gate.

Other modifications are possible. If more than five configurations are required, the number of configuration pads can be reduced by double-bonding the configuration pin to bond-in two 1-of-n codes (e.g. two pads making a 1-of-2 code and three pads making a 1-of-3 code for a total of six combinations). Using this technique, six configurations can be supported by only 5 configuration pads. The five pads are arranged in a group of two and a group of three, and each group has a separate cross-coupled NAND (or NOR) latch. The 1-of-2 and 1-of-3 output codes can then be combined to produce a 1-of-6 code. With six configuration pads, up to 9 configurations are supported (using two 1-of-3 code schemes). The limiting factors on extending this scheme for even more configurations are:

1. Maximum number of bond wires which may be attached to a single pin;
2. Maximum angle of the bond wire(s). This effect can be reduced by stacking the configuration pads in multiple rows (an nxm array of pads), but then the maximum length of a bond wire also becomes a factor.

Note that if the configuration pin is a most-preferred pin input, up to two bond wires can be used to bond-in the configuration with no loss of testability. A most-preferred pin is an input-only pin or a bidirectional pin which has the input function enabled on power-up. An output pin can also be a most-preferred pin if the integrated circuit is not driving the output pin at power-up and the pin is converted to a bidirectional pin in order to receive an external signal used to configure the mode. This can be performed by connecting one set of mode pads to N-channel electrostatic discharge (ESD) protection diodes, while connecting another set of mode pads to P-channel electrostatic discharge (ESD) protection diodes. By connecting in this manner, open and short testing can be done for both wire bond connections. If the configuration pin is a less-preferred or least-preferred pin, at least two bond wires are needed and the proper connection of the mode bond pad to the package post is not testable. A less-preferred pin is a bidirectional or output pin which is driven by the integrated circuit at power-up. The least-preferred pin is a power or ground pin of the integrated circuit.

Figure 13:
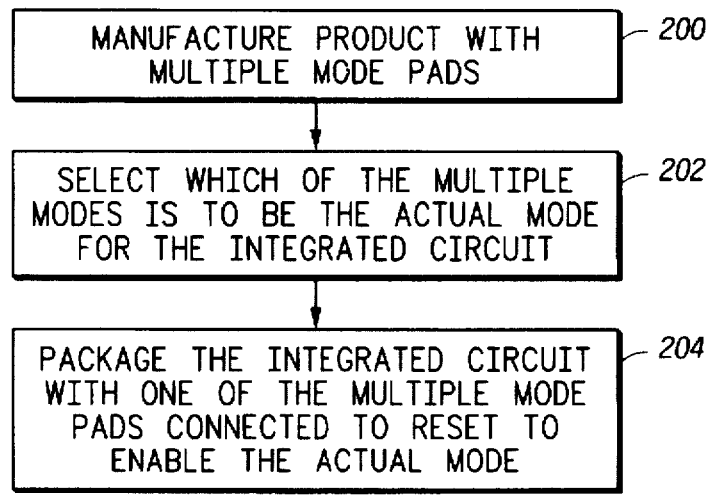
FIG. 13 illustrates, in a flow chart, a method of making an integrated circuit having a specific actual mode of operation in accordance with the present invention.

Shown in FIG. 13 is a process flow in accordance with one embodiment of the present invention. In step 200, conventional processing techniques are used to manufacture an integrated circuit having mode circuitry and functional circuitry such that the integrated circuit is capable of operating in several modes and has multiple mode bond pads, wherein each mode bond pad corresponds to one of the several operating modes of the integrated circuit. In step 202 the operating mode of the integrated circuit is selected and the corresponding mode bonding pad is selected. In step 204, the integrated circuit is then packaged and the previously selected mode bonding pad is electrically connected to a package post so that the integrated circuit operates with the selected operating mode.

In one form, the control signals 150–160 in FIG. 12 can configure the integrated circuit (IC) 100 to respond to a reset signal which is active low if the selected mode bond pad is the first mode bond pad and can configure the integrated circuit (IC) 100 to respond to a reset signal which is active high if the selected mode bond pad is the second mode bond pad or the third mode bond pad.

Also, the signals 150–160 can be used to interface the integrated circuit 100 to a bus protocol using a single external terminal as a read/write signal is used if the selected mode bond pad is the first mode bond pad, and the signals 150–160 can be used to interface the integrated circuit 100 to a bus protocol using a first external terminal to enable read operations and a second terminal to enable write operation is used if the selected mode bond pad is the second mode bond pad or the third mode bond pad. In addition, the signals 150–160 can configure the integrated circuit 100 to access a multiplexed address/data bus if the selected mode bond pad is the third mode bond pad, and the signals 150–160 can configure the integrated circuit 100 to access a separate address bus and a separate data bus if the selected mode bond pad is the first mode bond pad or the third mode bond pad. In general, the signals 150–160 determine how the integrated circuit 100 will configure and use external terminals.

Different computers export and/or decode different opcodes for processing. The signals 150–160 can be used to determine which opcodes are either executed by the integrated circuit 100 or can determine which opcodes the integrated circuit 100 exports for use by an external device.

While the present invention has been illustrated and described with reference to specific embodiments, further modifications and improvements will occur to those skilled in the art. For example, while the post 102 is illustrated in FIG. 12 as preferably being an input pin or a bi-directional pin, an output pin can also serve a similar function mode select function. It is to be understood, therefore, that this invention is not limited to the particular forms illustrated and that it is intended in the appended claims to cover all modifications that do not depart from the spirit and scope of this invention.

What is claimed is:

1. A method for providing an integrated circuit, the method comprising the steps of:

manufacturing an integrated circuit containing mode circuitry and functional circuitry wherein the mode circuitry is coupled to the functional circuitry, the integrated circuit comprises a first mode bond pad, a second mode bond pad, and a third mode bond pad wherein each of the first mode bond pad, the second mode bond pad, and the third mode bond pad are electrically coupled to the mode circuitry;

determining a selected mode in which the functional circuitry of the integrated circuit is to operate;

packaging the integrated circuit in a package wherein an external connection of the package is coupled to a selected pad wherein the selected pad is one of either the first mode bond pad, the second mode bond pad, or the third mode bond pad, the external connection adapted to be coupled to a signal which changes logic state some time during operation of the integrated circuit; and wherein coupling of the external connection to the selected pad allows an electrical signal, provided via the external connection, to stimulate generation of a bus mode control signal in the mode circuitry wherein the bus mode control signal enables the functional circuitry to operate in the selected mode, the selected mode determining a bus protocol the integrated circuit will use to communicate with circuitry external to the integrated circuit.

2. The method of claim 1 wherein the electrical signal results in a latched control value within the mode circuitry, the latched control value being used to generate the mode control signal.

3. The method of claim 1 wherein the mode circuitry has three output terminals for providing three mode control signals wherein only one mode control signal is enabled due to the step of packaging.

4. The method of claim 1 wherein the selected mode and the step of packaging results in two of the first mode bond pad, the second mode bond pad, and the third mode bond pad being unselected bond pads wherein no external connection of the package is coupled to the unselected bond pads.

5. The method of claim 1 wherein the external connection is a reset external terminal of the package which is used to reset the integrated circuit, a reset signal supplied via the reset external terminal therefore being the electrical signal.

6. The method of claim 1 wherein the external connection is a connection selected from a group consisting of: a TAB connection, a wire bonded connection, and a conductive bump.

7. The method of claim 1 wherein the first mode bond pad, the second mode bond pad, and the third mode bond pad are located laterally adjacent each other on a periphery of the integrated circuit.

8. An integrated circuit comprising:

a first mode bond pad;

a second mode bond pad;

a third mode bond pad;

mode circuitry coupled to the first, second, and third mode bond pads;

a conductive package connection coupled to a selected mode bond pad selected from the first, second, and third mode bond pads, all other of the first, second, and third mode bond pads which are unselected being uncoupled from any external package connection, the conductive package connection being adapted to be coupled to a signal which changes logic state some time during operation of the integrated circuit; and wherein the selected mode bond pad is electrically coupled to the mode circuitry so that, when an electrical signal is present on the conductive package connection, the mode circuitry generates a control signal which configures the integrated circuit for operation in one of at least three modes of operation wherein the one of at least three modes of operation selects one of three bus interface methodologies which the integrated circuit uses to communicate with circuitry external to the integrated circuit.

9. The integrated circuit of claim 8 wherein the conductive package connection coupled to the selected bond pad is a external reset terminal of the integrated circuit which performs a reset operation on the integrated circuit.

10. The integrated circuit of claim 8 wherein the first, second, and third mode bond pads are located laterally adjacent each other at a peripheral portion of the integrated circuit, and wherein the first, second, and third mode bond pads are formed in close proximity to a conductive portion of the conductive package connection.

11. The integrated circuit of claim 8 wherein the mode circuitry generates: (1) a first mode enable signal; (2) a second mode enable signal; (3) a third mode enable signal; (4) a reset signal; (5) a disable signal; and (6) a bus type signal.

12. The integrated circuit of claim 11 wherein only one of the first mode enable signal, second mode enable signal, and third mode enable signal are active at any one time.

13. The integrated circuit of claim 8 wherein the mode circuitry generates: (1) a first mode enable signal; (2) a second mode enable signal; and (3) a third mode enable signal.

14. The integrated circuit of claim 8 wherein a reset signal of the integrated circuit is active low if the selected mode bond pad is the first mode bond pad and wherein the reset signal of the integrated circuit is active high if the selected mode bond pad is the second mode bond pad or the third mode bond pad.

15. The integrated circuit of claim 8 wherein a bus protocol using a single external terminal as a read/write signal is used if the selected mode bond pad is the first mode bond pad and a bus protocol using a first external terminal to enable read operations and a second terminal to enable write operation is used if the selected mode bond pad is the second mode bond pad or the third mode bond pad.

16. The integrated circuit of claim 8 wherein a multiplexed address/data bus is configured for the integrated circuit if the selected mode bond pad is the third mode bond pad and a separate address bus and a separate data bus are both configured for the integrated circuit if the selected mode bond pad is the first mode bond pad or the third mode bond pad.

17. The integrated circuit of claim 8 wherein the integrated circuit is a peripheral device adapted to be coupled to a central processing unit (CPU).

18. The integrated circuit of claim 8 wherein the control signal generated by the mode circuitry determines a configuration of external terminals which are used to communicate with the integrated circuit.

19. The integrated circuit of claim 8 wherein the control signal generated by the mode circuitry determines a set of opcodes which are validly output by the integrated circuit.

20. The integrated circuit of claim 8 wherein the control signal generated by the mode circuitry determines a set of opcodes which are capable of being received and decoded by the integrated circuit.

21. An integrated circuit comprising:

a plurality of external terminals coupled to functional circuitry within the integrated circuit;

a plurality of mode bond pads on the integrated circuit;

a reset terminal of the integrated circuit, the reset terminal being coupled to a selected mode bond pad among the plurality of mode bond pads; and mode circuitry coupled to each mode bond pad in the plurality of mode bond pads, the mode circuitry receiving a reset signal via the selected mode bond pad, wherein the reset signal on the selected mode bond pad stimulates the mode circuitry to enable one mode control signal among a plurality of mode control signals, the one mode control signal configuring the plurality of external terminals to interface to a specific central processing unit (CPU) bus system external to the integrated circuit.

* * * * *